(12) United States Patent
Park

(10) Patent No.: US 11,751,458 B2
(45) Date of Patent: Sep. 5, 2023

(54) TRANSPARENT DISPLAY DEVICE HAVING PIXEL CAPABLE OF ENHANCING TRANSPARENCY

(71) Applicant: LG Display Co., Ltd., Seoul (KR)

(72) Inventor: Jae-Hee Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 212 days.

(21) Appl. No.: 17/108,856

(22) Filed: Dec. 1, 2020

(65) Prior Publication Data

US 2021/0175298 A1 Jun. 10, 2021

(30) Foreign Application Priority Data

Dec. 4, 2019 (KR) .................... 10-2019-0160139

(51) Int. Cl.
 *G09G 3/32* (2016.01)
 *H10K 59/35* (2023.01)
 *G09G 3/3225* (2016.01)

(52) U.S. Cl.
 CPC ......... *H10K 59/353* (2023.02); *G09G 3/3225* (2013.01)

(58) Field of Classification Search
 CPC . H01L 27/32; G09G 3/32; G09G 3/34; G09G 3/36; G09G 3/3225; G09G 2300/0452; H10K 59/353; H10K 59/12; H10K 59/351; H10K 50/80; H10K 59/00
 See application file for complete search history.

(56) References Cited

U.S. PATENT DOCUMENTS

| | | | | |
|---|---|---|---|---|
| 2004/0164668 A1* | 8/2004 | Kanno | ............... | H01L 27/322 313/506 |
| 2014/0374716 A1* | 12/2014 | Kim | ............... | H01L 27/3232 257/40 |
| 2015/0214280 A1* | 7/2015 | Furuie | ............... | H01L 27/3213 257/89 |
| 2016/0163770 A1* | 6/2016 | Kim | ............... | H01L 27/326 257/40 |
| 2016/0301031 A1* | 10/2016 | Mimura | ............... | H01L 27/3276 |
| 2017/0053589 A1* | 2/2017 | Huang | ............... | G09G 3/3233 |
| 2017/0053971 A1 | 2/2017 | Sato | | |
| 2017/0084572 A1* | 3/2017 | Liu | ............... | H01L 51/5284 |
| 2017/0110521 A1* | 4/2017 | Park | ............... | H01L 51/5209 |
| 2017/0194390 A1* | 7/2017 | Kim | ............... | H01L 51/5221 |
| 2017/0214003 A1* | 7/2017 | Lee | ............... | H01L 51/5262 |
| 2018/0341160 A1* | 11/2018 | Gong | ............... | H01L 27/124 |
| 2020/0225535 A1* | 7/2020 | Wang | ............... | G02F 1/133553 |

FOREIGN PATENT DOCUMENTS

| | | |
|---|---|---|
| EP | 2 866 261 A1 | 4/2015 |
| KR | 10-2015-0050318 A1 | 5/2015 |
| KR | 10-2016-0047061 A1 | 5/2016 |
| KR | 10-2016-0130042 A1 | 11/2016 |
| KR | 10-2017-0073018 A1 | 6/2017 |
| KR | 10-2017-0079923 A1 | 7/2017 |

OTHER PUBLICATIONS

European Search Report dated Mar. 3, 2021 issued in corresponding Patent Application No. 20210614.2 (8 pages).

\* cited by examiner

*Primary Examiner* — Pegeman Karimi

(74) *Attorney, Agent, or Firm* — Polsinelli PC

(57) ABSTRACT

A display device includes a lower substrate, and a pixel including sub-pixels having one transparent area defined to transmit light on the lower substrate and a plurality of emissive areas disposed around the one transparent area and defined to emit light with at least three different colors.

7 Claims, 12 Drawing Sheets

TRANSPARENT DISPLAY DEVICE HAVING PIXEL CAPABLE OF ENHANCING TRANSPARENCY

CROSS-REFERENCE TO RELATED APPLICATION

This application claims the benefit of Korean Patent Application No. 10-2019-0160139, filed on Dec. 4, 2019, which is hereby incorporated by reference in its entirety.

BACKGROUND

Field of the Disclosure

The present disclosure relates to a display device.

Description of the Background

With the development of information technologies, markets of display devices that are connection media between a user and information have expanded. Thus, display devices such as an organic light emitting display (OLED), a quantum dot display (QDD), and liquid crystal display (LCD) have been increasingly used.

The OLED or the like includes a display panel including a plurality of sub-pixels arranged in a matrix form, a driver for outputting a driving signal for driving the display panel, and a power supply for generating power to be supplied to the display panel or the driver. The driver includes a scan driver for supplying a scan signal (or a gate signal) to the display panel, and a data driver for supplying a data signal to the display panel. The aforementioned display device displays an image by enabling a selected sub-pixel to transmit light therethrough or to directly emit light when a driving signal, e.g., a scan signal and a data signal is supplied to sub-pixels formed on a display panel.

Some of the aforementioned display devices, for example, the OLED has the excellent response speed, viewing angle, and contrast ratio, and is easily thinned. The OLED includes a display panel configured to have a separate transparent area as well as a light emissive area, and thus, has been studied as a next-generation display device in various fields.

SUMMARY

The present disclosure provides a display device including a lower substrate, and a pixel including sub-pixels having one transparent area defined to transmit light on the lower substrate and a plurality of emissive areas disposed around the one transparent area and defined to emit light with at least three different colors.

In another aspect, the present disclosure provides a display device including a lower substrate, and a pixel including sub-pixels having one transparent area defined to transmit light on the lower substrate and one emissive area defined to emit light, wherein the one emissive area has an "L" shape.

Yet another aspect, the present disclosure provides a display device including a lower substrate, and a pixel including sub-pixels having one transparent area defined to transmit light on the lower substrate and a plurality of emissive areas disposed on four sides of the one transparent area and defined to emit light with at least three different colors.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail aspects of the disclosure examples of which are illustrated in the accompanying drawings.

With the development of information technologies, markets of display devices that are connection media between a user and information have expanded. Thus, display devices such as an organic light emitting display (OLED), a quantum dot display (QDD), and liquid crystal display (LCD) have been increasingly used.

Hereinafter, an OLED including an organic light emitting diode will be described with regard to exemplary aspects of the present disclosure but the present disclosure may also be applied to other display devices including an inorganic light emitting display.

Figure 1:
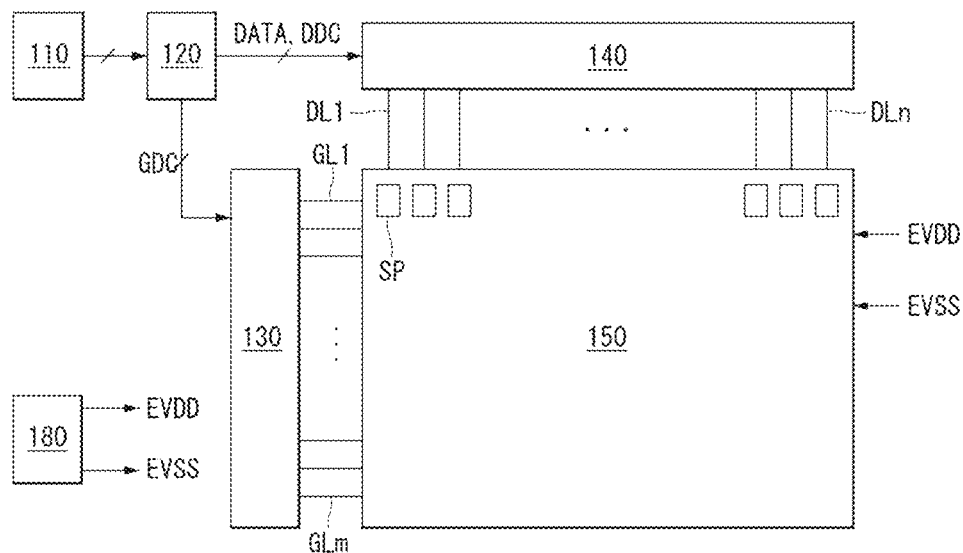
FIG. 1 is a schematic block diagram showing an organic light emitting display (OLED)
Figure 2:
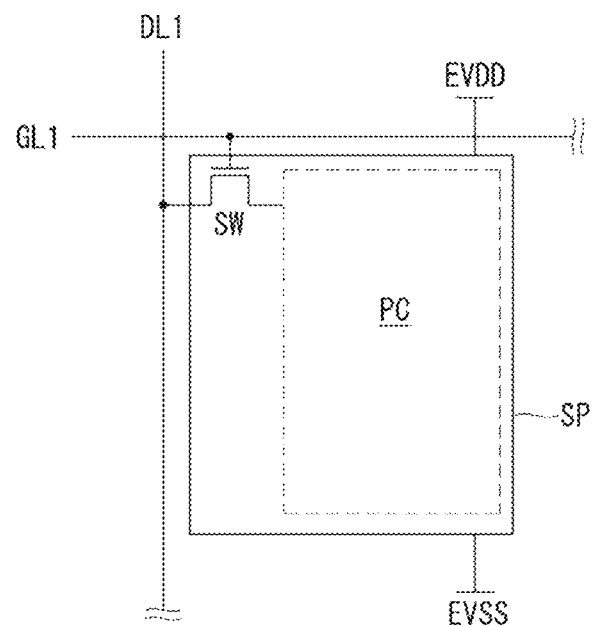
FIG. 2 is a schematic diagram showing a configuration of a sub-pixel shown in FIG. 1.
Figure 3:
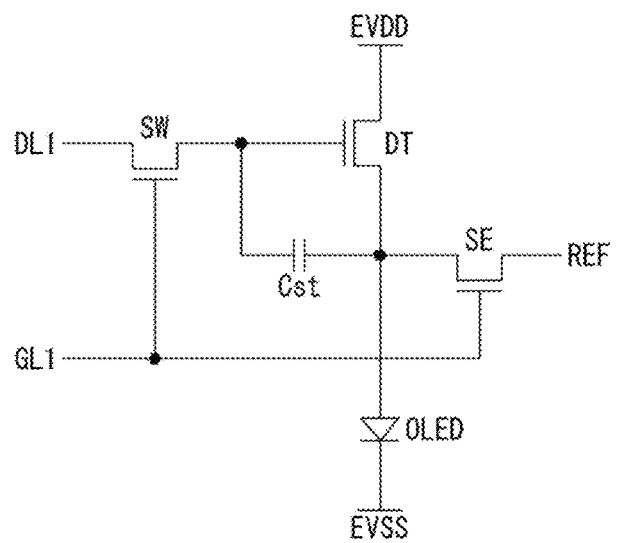
FIG. 3 is a diagram showing an example of a detailed circuit configuration of a sub-pixel shown in FIG. 1.
Figure 4:
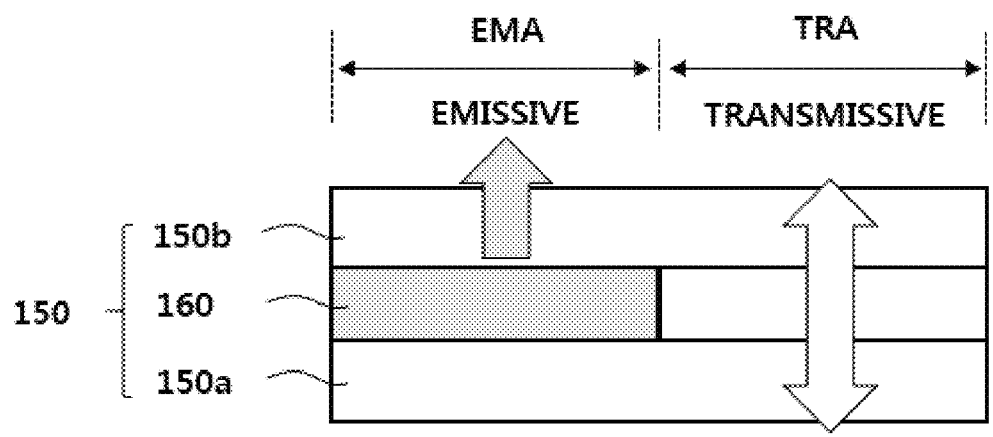
FIG. 4 is a cross-sectional view for explaining a function of a display panel shown in FIG. 1.

FIG. 1 is a schematic block diagram showing an OLED, FIG. 2 is a schematic diagram showing a configuration of a sub-pixel shown in FIG. 1, FIG. 3 is a diagram showing an example of a detailed circuit configuration of a sub-pixel shown in FIG. 1, and FIG. 4 is a cross-sectional view for explaining a function of a display panel shown in FIG. 1.

As shown in FIG. 1, the OLED may include an image supply 110, a timing controller 120, a scan driver 130, a data driver 140, a display panel 150, and a power supply 180.

The image supply 110 may output various driving signals with an image data signal supplied from the outside or an image data signal stored in an internal memory. The image supply 110 may supply a data signal and various driving signals to the timing controller 120.

The timing controller 120 may output a gate timing control signal GDC for controlling operation timing of the scan driver 130, a data timing control signal DDC for controlling operation timing of the data driver 140, and various synchronization signals (vertical synchronization signal Vsync and horizontal synchronization signal Hsync). The timing controller 120 may supply the data signal DATA supplied from the image supply 110 with the data timing control signal DDC to the data driver 140.

The scan driver 130 may output the scan signal (or a gate signal) in response to the gate timing control signal GDC or the like, which is supplied from the timing controller 120. The scan driver 130 may supply the scan signal to sub-pixels included in the display panel 150 through scan lines GL1 to GLm. The scan driver 130 may be formed in the form of an integrated circuit (IC) or may be directly formed on the display panel 150 in a gate in panel method.

The data driver 140 may sample and latch a data signal DATA in response to the data timing control signal DDC or the like supplied from the timing controller 120, may convert the data signal DATA into a data voltage in the form of an analog signal corresponding to a gamma reference voltage, and may output the data voltage. The data driver 140 may supply a data voltage to sub-pixels included in the display panel 150 through data lines DL1 to DLn. The data driver 140 may be formed in the formed of an integrated circuit (IC) and may be installed on the display panel 150 or may be installed on a printed circuit board, but the present disclosure is not limited thereto.

The power supply 180 may generate and output a first driving voltage EVDD with a high potential and a second driving voltage EVSS with a low potential based on an external input voltage supplied from the outside. The power supply 180 may generate and output a voltage (e.g., a scan high voltage or a scan low voltage) required to drive the scan driver 130 or a voltage (a drain voltage or a half drain voltage) required to drive the data driver 140 as well as the first and second driving voltages EVDD and EVSS.

The display panel 150 may display an image in response to the driving signal including a scan signal and the data voltage output from the driver including the scan driver 130 and the data driver 140, and the first and second driving voltages EVDD and EVSS output from the power supply 180. The sub-pixels of the display panel 150 may directly emit light.

As shown in FIG. 2, one sub-pixel SP may be defined by a first data line DL1, a first scan line GL1, the first driving voltage line EVDD, and the second driving voltage line EVSS. In addition, one sub-pixel SP may include a switching transistor SW, and a pixel circuit PC including a driving transistor, a storage capacitor, an organic light emitting diode, or the like.

The sub-pixel SP used in the OLED may directly emit light and may have a complicated circuit configuration compared with a liquid crystal display. In addition, a compensation circuit for compensating for degradation of a driving transistor for supplying driving current to an organic light emitting diode as well as the organic light emitting diode for emitting light may be complicated and diversified. Thus, it may be noted that the pixel circuit PC included in the sub-pixel SP is illustrated in the form of a block. However, according to the present disclosure, the sub-pixel SP may be embodied based on at least the configuration shown in FIG. 3.

As shown in FIG. 3, one sub-pixel SP may include the switching transistor SW, a driving transistor DT, a sensing transistor SE, a storage capacitor CST, and an organic light emitting diode OLED.

The switching transistor SW may have a gate electrode connected to the first scan line GL1, a first electrode connected to the first data line DL1, and a second electrode connected to a gate electrode of the driving transistor DT and one end of the storage capacitor CST. The switching transistor SW may apply a data voltage transferred through the first data line DL1 to one end of the storage capacitor CST.

The driving transistor DT may have the gate electrode connected to the second electrode of the switching transistor SW and one end of the storage capacitor CST, a first electrode connected to the first driving voltage line EVDD, and a second electrode connected to the other end of the storage capacitor CST and an anode of the organic light emitting diode OLED. The driving transistor DT may generate driving current based on a data voltage stored in the storage capacitor CST.

The sensing transistor SE may have a gate electrode connected to the first scan line GL1, a first electrode connected to the second electrode of the driving transistor DT and an anode of the organic light emitting diode OLED, and a second electrode connected to a referenced line REF. The sensing transistor SE may sense the characteristics (threshold voltage or current mobility) of the driving transistor DT or the characteristics (threshold voltage) of the organic light emitting diode OLED and may then transfer the sensed characteristics to an external circuit.

The storage capacitor CST may have one end connected to the second electrode of the switching transistor SW and the gate electrode of the driving transistor DT, and the other end connected to the second electrode of the driving transistor DT, the first electrode of the sensing transistor SE, and the anode of the organic light emitting diode OLED. The storage capacitor CST may store a data voltage and may transfer the data voltage to the gate electrode of the driving transistor DT.

The organic light emitting diode OLED may have the anode connected to the second electrode of the driving transistor DT, the first electrode of the sensing transistor SE, and the other end of the storage capacitor CST, and a cathode connected to the second driving voltage line EVS S. The organic light emitting diode OLED may emit light in response to the driving current generated by the driving transistor DT. Hereinafter, an example in which a display panel is embodied based on the sub-pixel shown in FIG. 3 will be described with regard to the present disclosure.

As shown in FIG. 4, the display panel 150 according to a first aspect of the present disclosure may include a display part 160 positioned between a lower substrate 150a and an upper substrate 150b. The display part 160 may be embodied based on the sub-pixel described with reference to FIG. 3.

The lower substrate 150a and the upper substrate 150b may be selected as the same material or different materials. For example, the lower substrate 150a may be selected as a single material such as resin having flexibility or glass having rigidity, and the upper substrate 150b may be selected as a composite material such as organic/inorganic material, but the present disclosure is not limited thereto.

The display part 160 may have an emissive area EMA that directly emits light and a transparent area TRA that does not emit light but transmits external light therethrough. In order to embody the display panel 150 as described above, an example in which one sub-pixel includes the emissive area EMA and the transparent area TRA is described, but the present disclosure is not limited thereto.

As described above, the OLED has the excellent response speed, viewing angle, and contrast ratio, and is easily thinned. The OLED includes a display panel configured to have a separate transparent area as well as a light emissive area, and thus, has been studied as a next-generation display device in various fields. The present disclosure provides the following configuration in order to enhance the transparency and haze of an OLED having an emissive area and a transparent area.

Figure 5:
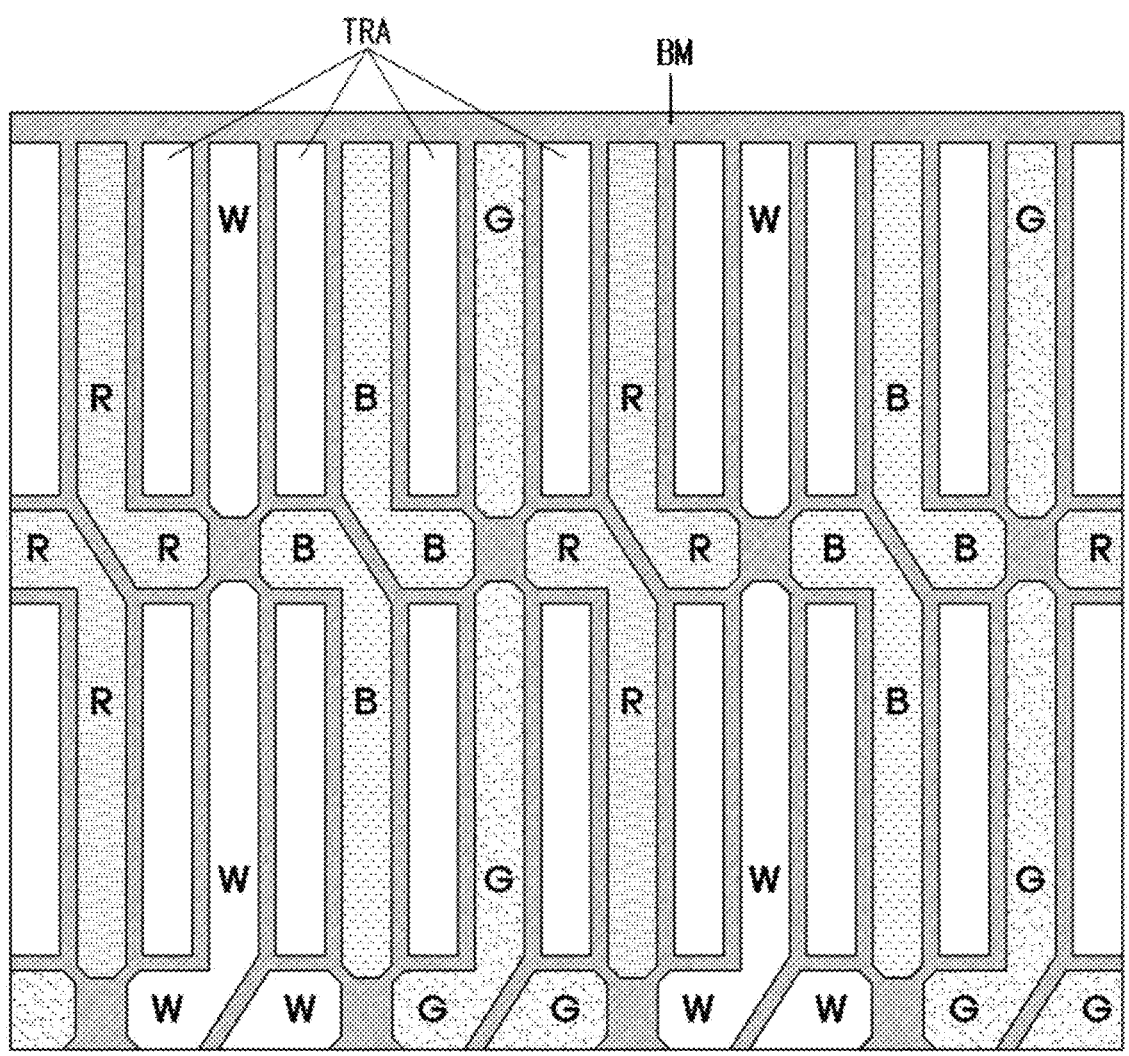
FIG. 5 is a plan view of arrangement of pixels according to the first aspect of the present disclosure.
Figure 6:
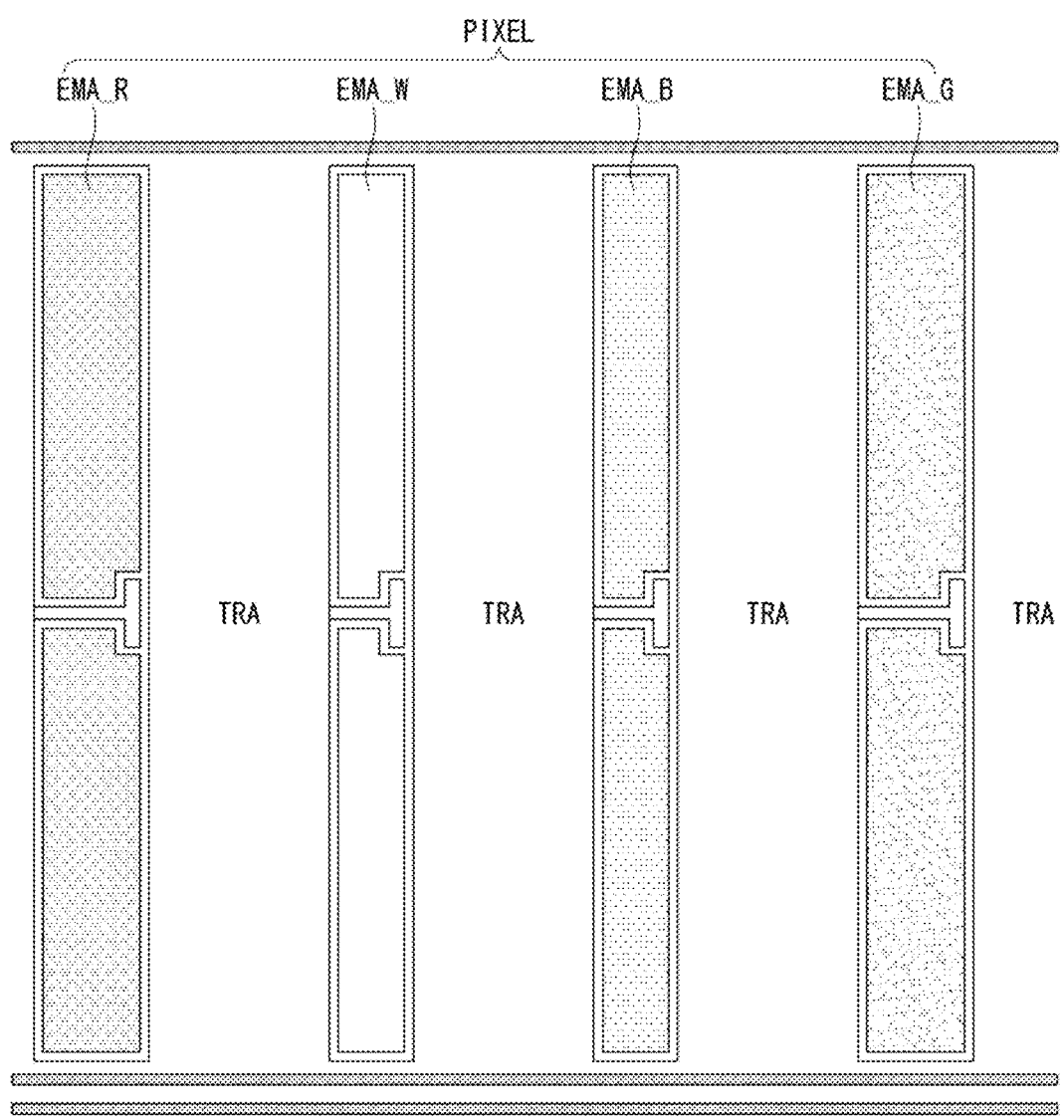
FIG. 6 is a plan view of arrangement of a portion of one pixel illustrated in FIG. 5.
Figure 7:
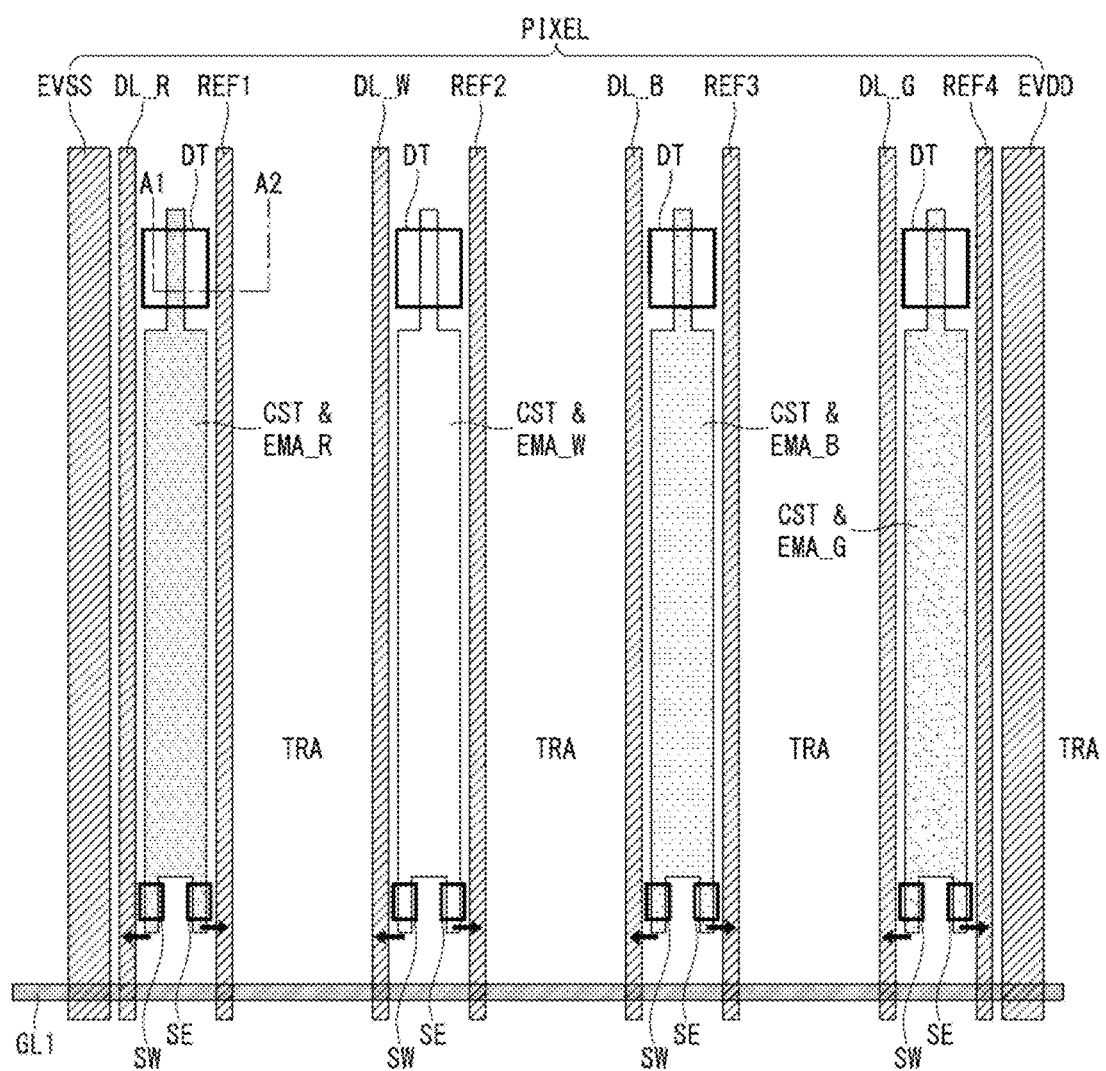
FIG. 7 is a diagram of arrangement of one pixel illustrated in FIG. 6.
Figure 8:
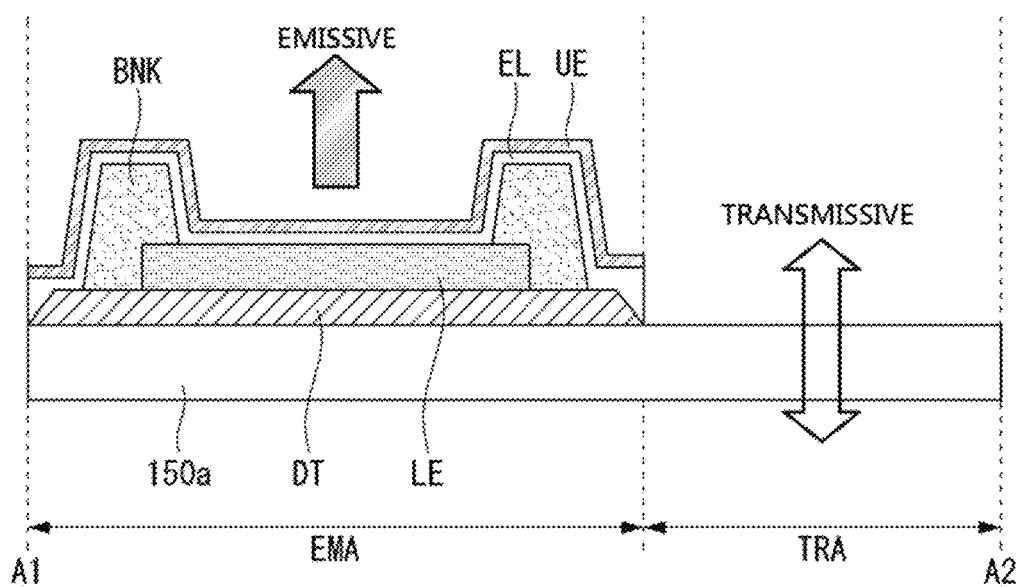
FIG. 8 is a cross-sectional view showing an example of a region taken along A1-A2 of FIG. 7.

FIG. 5 is a plan view of arrangement of pixels according to the first aspect of the present disclosure, FIG. 6 is a plan view of arrangement of a portion of one pixel illustrated in FIG. 5, FIG. 7 is a diagram of arrangement of one pixel illustrated in FIG. 6, and FIG. 8 is a cross-sectional view showing an example of a region taken along A1-A2 of FIG. 7.

As shown in FIG. 5, pixels according to the first aspect may include sub-pixels each including the emissive area (e.g., R, W, B, or G) and the transparent area TRA. An example in which one pixel is defined by sub-pixels (R, W, B, G) that emits red, white, blue, and green light is described, but the present disclosure is not limited thereto. A portion between the transparent area TRA and the emissive area (e.g., R, W, B, or G) may be defined by a black matrix BM, but the present disclosure is not limited thereto.

The emissive area (e.g., R, W, B, or G) may have an "L" shape, and the transparent area TRA may have a rectangular shape different from the emissive area (e.g., R, W, B, or G). In the emissive area (e.g., R, W, B, or G), a vertical-direction portion may have a long rectangular shape and a horizontal-direction portion may have a shorter polygonal shape than the vertical-direction portion.

In the emissive area (e.g., R, W, B, or G), two emissive areas (e.g., R or B) that emit light with the same color may have upper and lower parts that are adjacently disposed to each other. In this case, the lower emissive area of the two emissive areas (e.g., R) that emit light with the same color may be formed by rotating the upper emissive area by 180. As a result, two emissive areas (e.g., R) that are adjacently disposed to each other in up and down directions or right and left directions may configure a cross shape. A portion adjacent to two emissive areas (e.g., R or B) may configure a diagonal shape.

Opposite edges of a vertical-direction end that is not connected to a horizontal-direction part in the emissive area (e.g., R, W, B, or G) may be removed rather than being formed like a straight line, but the present disclosure is not limited thereto.

As shown in FIG. 6, one pixel PIXEL may include a red sub-pixel having a red emissive area EMA_R and the transparent area TRA, a white sub-pixel having a white emissive area EMA_W and the transparent area TRA, a blue sub-pixel having a blue emissive area EMA_B and the transparent area TRA, and a green sub-pixel having a green emissive area EMA_G and the transparent area TRA. In addition, viewed from the above, the red, white, blue, and green sub-pixels are arranged in the stated order, but the present disclosure is not limited thereto.

As shown in FIG. 7, the red emissive area EMA_R of the red sub-pixel may be defined by a red data line DL_R that is disposed on the left, a first reference line REF1 that is disposed on the right, and the first scan line GL1 that is disposed at a lower side. The transparent area TRA of the red sub-pixel may be defined by the first reference line REF1, a white data line DL_W adjacently disposed to a right side thereof, and the first scan line GL1 disposed at the lower side. The second driving voltage line EVSS may further disposed on the left of the red data line DL_R of the red sub-pixel. The second driving voltage line EVSS may correspond to a dummy voltage line that is further arranged to prevent voltage drop of the second driving voltage, and thus, may be omitted depending on the configuration of the display panel.

The white emissive area EMA_W of the white sub-pixel may be defined by the white data line DL_W disposed on the left, a second reference line REF2 disposed on the right side, and the first scan line GL1 disposed at the lower side. The transparent area TRA of the white sub-pixel may be defined by the second reference line REF2, a blue data line DL_B adjacently disposed to a right side thereof, and the first scan line GL1 disposed at the lower side.

The blue emissive area EMA_B of the blue sub-pixel may be defined by the blue data line DL_B disposed on the left, a third reference line REF3 disposed on the right, and the first scan line GL1 disposed at the lower side. The transparent area TRA of the blue sub-pixel may be defined by a third reference line REF3, a green data line DL_G adjacently disposed to a right side thereof, and the first scan line GL1 disposed at the lower side.

The green emissive area EMA_G of the green sub-pixel may be defined by a green data line DL_G disposed on the left, a fourth reference line REF4 disposed on the right, and the first scan line GL1 disposed at the lower side. The first driving voltage line EVDD may be further disposed at a right side of the fourth reference line REF4. The first driving voltage line EVDD corresponds to a dummy voltage line that is further disposed to prevent voltage drop of the first driving voltage, and thus, is omitted depending on the configuration of a display panel. Thus, the transparent area TRA of the green sub-pixel may be defined by the first driving voltage line EVDD disposed on the left, and the first scan line GL1 disposed at the lower side. The transparent area TRA may also be defined by the fourth reference line REF4 and the first scan line GL1 disposed at the lower side.

As described above with reference to FIG. 3, the red sub-pixel, the white sub-pixel, the blue sub-pixel, and the green sub-pixel may each include the switching transistor SW, the sensing transistor SE, the driving transistor DT, the storage capacitor CST, and an organic light emitting diode (not shown). In addition, based on the first scan line GL1, an arrangement relationship of the switching transistor SW, the sensing transistor SE, the driving transistor DT, the storage capacitor CST, and the organic light emitting diode (not shown) may be the same as in the red sub-pixel, the white sub-pixel, the blue sub-pixel, and the green sub-pixel, which will be described below.

The switching transistor SW and the sensing transistor SE are connected to the first scan line GL1, and thus, may be disposed at a lower side (a lower side of a storage capacitor) adjacent to the first scan line GL1. The driving transistor DT may be disposed at an upper side (an upper side of the storage capacitor) that is far away from the switching transistor SW and the sensing transistor SE.

The storage capacitor CST may be connected to the switching transistor SW, the sensing transistor SE, the driving transistor DT, and the organic light emitting diode (not shown) and requires a wide space in order to form capacitance, and thus, may be disposed between the switching transistor SW (or a sensing transistor) and the driving transistor DT. However, although each of the sub-pixels according to aspects of the present disclosure includes the switching transistor SW, the sensing transistor SE, the driving transistor DT, the storage capacitor CST, and the organic light emitting diode (not shown), but the present disclosure is not limited thereto.

The organic light emitting diode (not shown) may cover arrangement positions of the switching transistor SW, the sensing transistor SE, the driving transistor DT, and the storage capacitor CST, which are disposed therebelow, and thus, is omitted in FIG. 7. However, a configuration related to the organic light emitting diode (not shown) will be understood based on the following description of FIG. 8.

As shown in FIG. 8, the emissive area EMA_R and the transparent area TRA of the red sub-pixel may have different interlayer structures. The white sub-pixel, the blue sub-pixel, and the green sub-pixel may have interlayer structures shown in FIG. 8, and thus hereinafter, the configuration of the emissive area EMA_R and the transparent area TRA will be described below based on the red sub-pixel.

The driving transistor DT on the lower substrate 150a may be positioned in the emissive area EMA_R of the red sub-pixel. A lower electrode LE connected to a source electrode or a drain electrode of the driving transistor DT may be positioned on the driving transistor DT. The lower electrode LE may be an anode of the organic light emitting diode. The lower electrode LE may include a reflective layer.

A bank layer BNK that has an opening region through which the lower electrode LE is partially exposed and defines an emissive area may be positioned on the lower electrode LE. An emissive layer EL may be positioned on the bank layer BNK. An upper electrode UE may be positioned on the emissive layer EL. The upper electrode UE may be a cathode of the organic light emitting diode. The upper electrode UE may be selected as a transparent oxide material or the like for transmitting light of the emissive layer EL therethrough.

An example in which only the lower substrate 150a is present in the transparent area TRA of the red sub-pixel without another structure layer is illustrated. However, an insulating layer or the like that is commonly formed on an entire part of the lower substrate 150a irrespective of transmission of light may also be positioned in the transparent area TRA of the red sub-pixel.

The aforementioned first aspect of the present disclosure may have an effect of minimizing the width of a bank layer that occupies the largest area to embody a pixel by providing a pixel structure in which an emissive area and a transparent area are alternately disposed adjacent to each other. In addition, the first aspect of the present disclosure may have an effect of enhancing transparency by forming the sub-pixel in an "L" shape and enhancing haze characteristics by dividing the transparent area for each sub-pixel.

Figure 9:
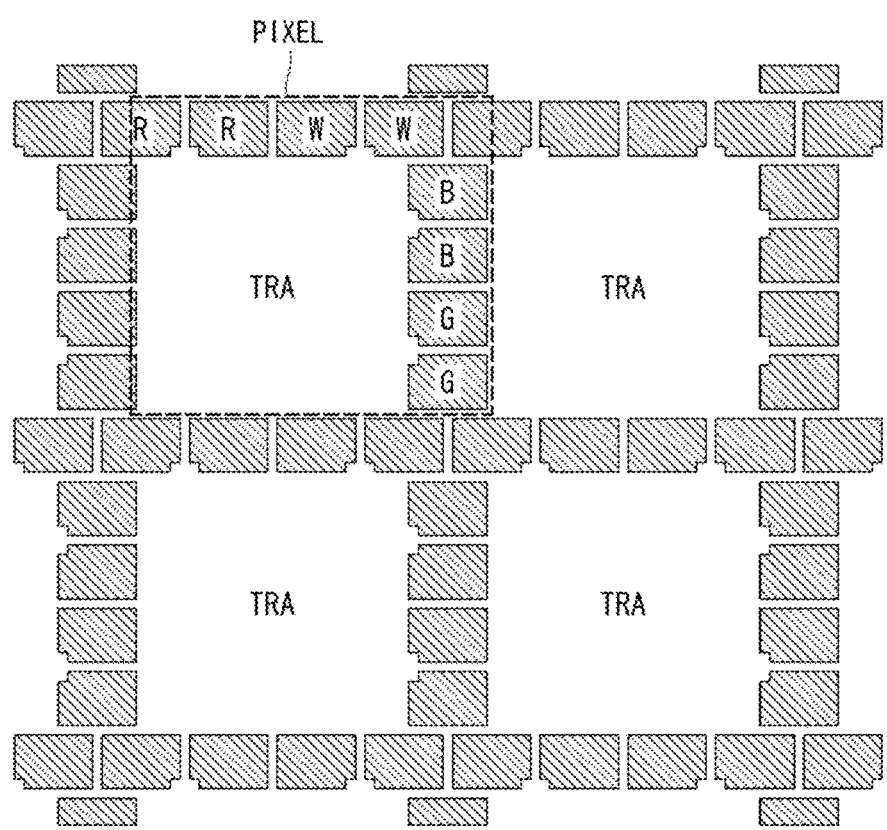
FIG. 9 is a first plan view of arrangement of pixels according to a second aspect of the present disclosure.
Figure 10:
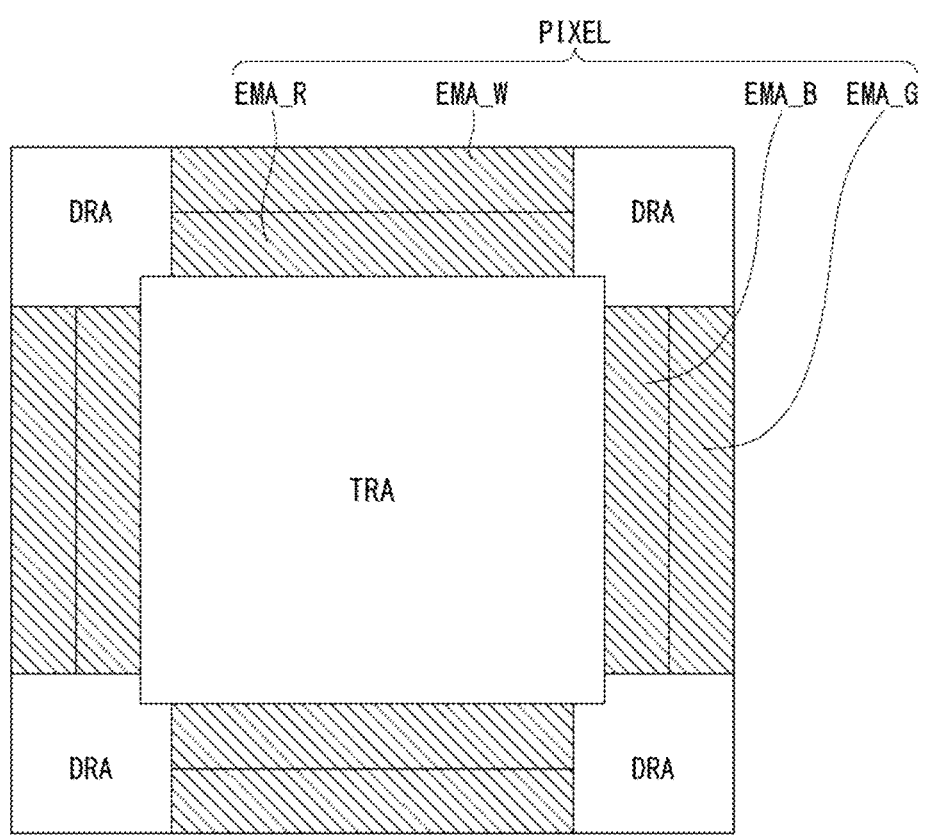
FIG. 10 is a second plan view of arrangement of pixels according to the second aspect of the present disclosure.
Figure 11:
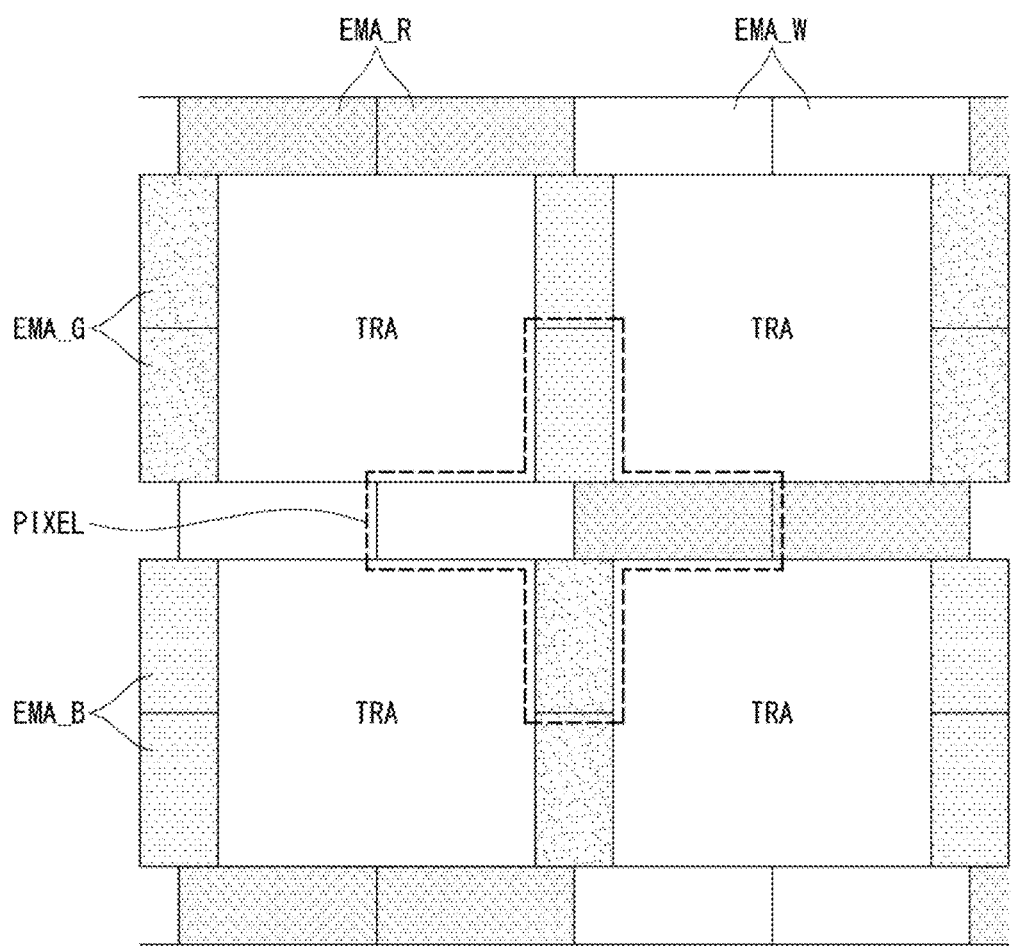
FIG. 11 is a third plan view of arrangement of pixels according to the second aspect of the present disclosure.
Figure 12:
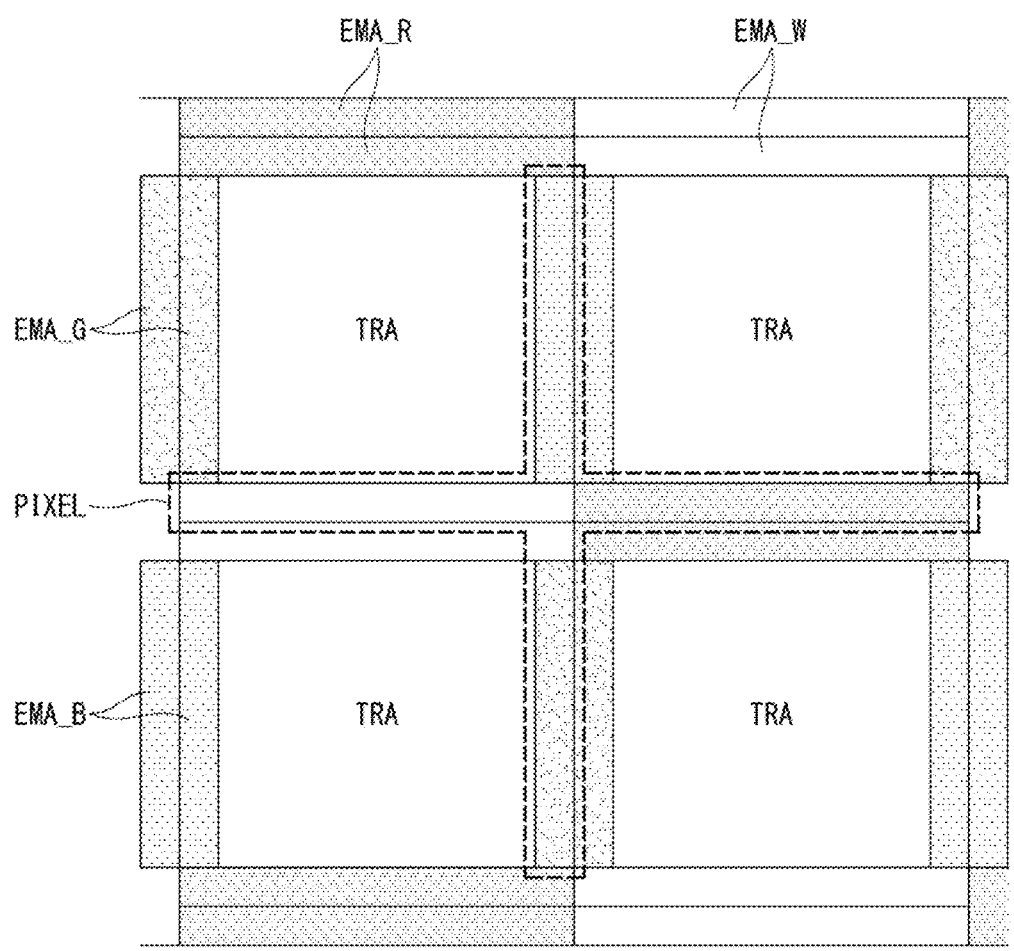
FIG. 12 is a fourth plan view of arrangement of pixels according to the second aspect of the present disclosure.
Figure 13:
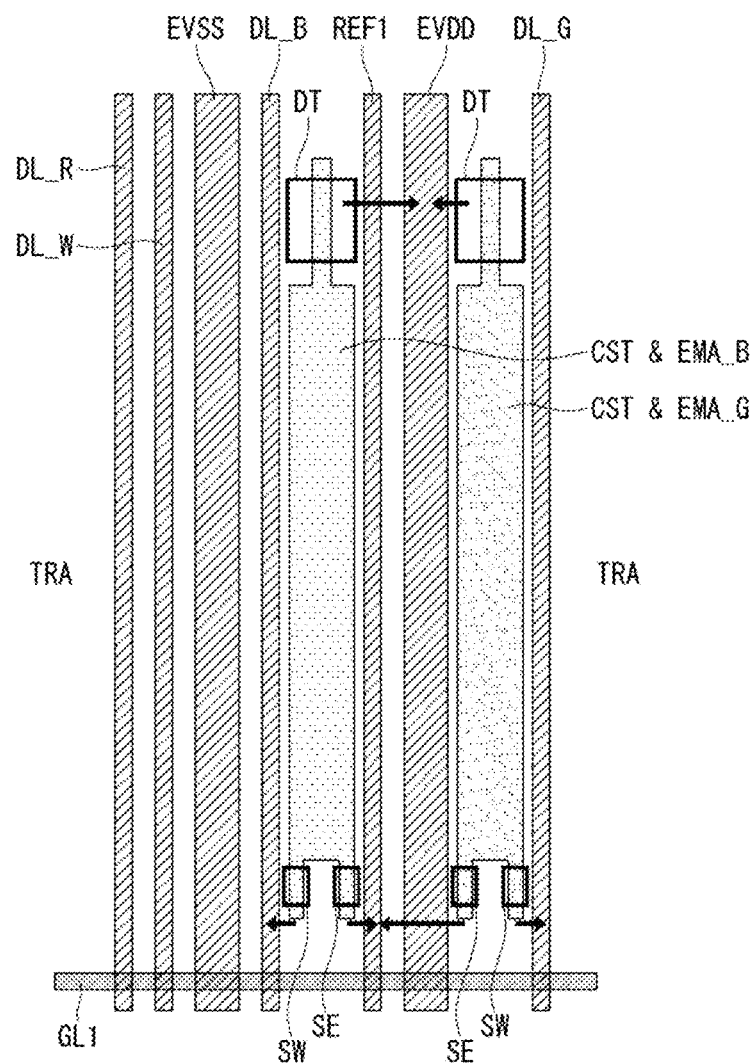
FIG. 13 is a diagram showing arrangement of two sub-pixels shown in FIG. 10.
Figure 14:
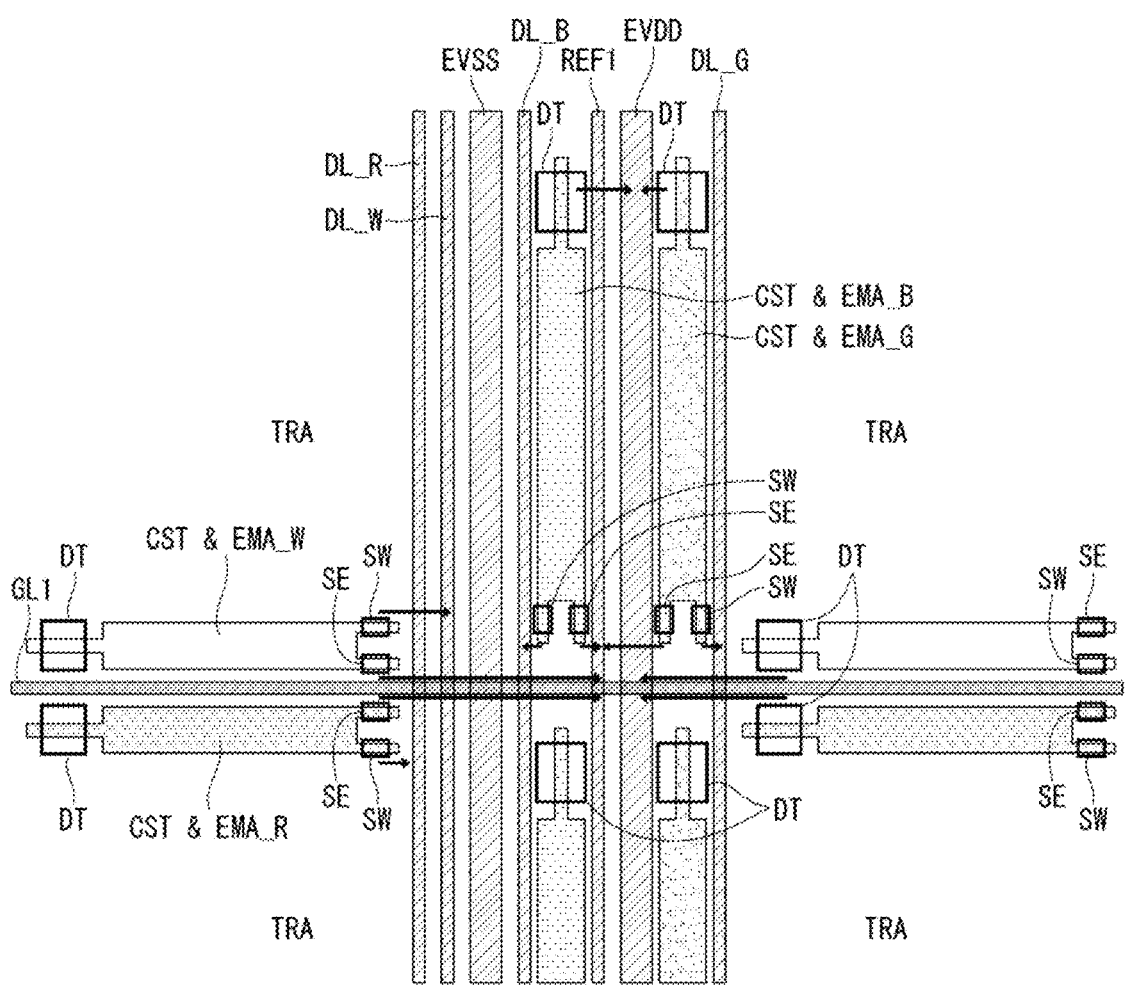
FIG. 14 is a diagram for further explaining another sub-pixel adjacent to the two sub-pixels shown in FIG. 10.

FIG. 9 is a first plan view of arrangement of pixels according to a second aspect of the present disclosure, FIG. 10 is a second plan view of arrangement of pixels according to the second aspect of the present disclosure, FIG. 11 is a third plan view of arrangement of pixels according to the second aspect of the present disclosure, FIG. 12 is a fourth plan view of arrangement of pixels according to the second aspect of the present disclosure, FIG. 13 is a diagram showing arrangement of two sub-pixels shown in FIG. 10, and FIG. 14 is a diagram for further explaining another sub-pixel adjacent to the two sub-pixels shown in FIG. 10.

As shown in FIG. 9, the pixels according to a first example of the second aspect may include sub-pixels each including an emissive area (e.g., R, W, B, or G) and the transparent area TRA. One pixel may be defined by sub-pixels (R, W, B, and G) that emit red, white, blue, and green light, but the present disclosure is not limited thereto. A portion between the transparent area TRA and the emissive area (e.g., R, W, B, or G) may be defined by the black matrix BM, but the present disclosure is not limited thereto.

The emissive area (e.g., R, W, B, or G) may have a square shape, and the transparent area TRA may have a square shape having four sides surrounded (or shared) by a plurality of emissive areas (e.g., R, W, B, or G). That is, a plurality of pixels that surround one transparent area TRA may have a shape surrounding one transparent area TRA. Two emissive areas that emit light with the same color (e.g., R) may be defined as one sub-pixel except that only regions are defined.

In the emissive area (e.g., R, W, B, or G), two emissive areas (e.g., R or W) that emit light with the same color may be adjacently disposed to each other right and left in a horizontal direction, and two emissive areas (e.g., B or G) that emit light with the same color may be adjacently disposed to each other up and down in a vertical direction. As a result, an emissive area included in one pixel PIXEL may have a shape formed by rotating an "L" shape by 180 degrees in a counterclockwise direction (reversed "L" shape), and an emissive area that defines another pixel may be configured in an "L" shape in an opposite area. That is, at least two pixels may share one transparent area TRA while surrounding four sides of one transparent area TRA.

As shown in FIG. 10, the pixels according to a second example of the second aspect may be formed in such a way that a plurality of pixels that surrounds one transparent area TRA shares one transparent area TRA in the same or similar form as in the first example. To this end, one pixel PIXEL may include a red sub-pixel having the red emissive area EMA_R and the transparent area TRA, a white sub-pixel having the white emissive area EMA_W and the transparent area TRA, a blue sub-pixel having the blue emissive area EMA_B and the transparent area TRA, and a green sub-pixel having the green emissive area EMA_G and the transparent area TRA.

The red emissive area EMA_R and the white emissive area EMA_W may be disposed in a horizontal direction and may be adjacently disposed to each other up and down, and the blue emissive area EMA_B and the green emissive area EMA_G may be disposed in a vertical direction and may be adjacently disposed to each other right and left. As a result, one pixel PIXEL may have a shape formed by rotating an "L" shape by 180 degrees in a counterclockwise direction when the transparent area TRA is excluded.

Viewed from a portion of pixels having a shape formed by rotating an "L" shape by 180 degrees in a counterclockwise direction, the red sub-pixel and the white sub-pixel are arranged in a horizontal direction, and the blue sub-pixel and the green sub-pixel are arranged in a vertical direction, but the present disclosure is not limited thereto.

For example, one pixel PIXEL is formed in such a way that a circuit area DRA including circuits for driving an organic light emitting diode is positioned at a corner portion (or an edge portion) of the transparent area TRA. However, sub-pixels according to the present disclosure may be selected as a top emission type in which light is emitted in an opposite direction to a lower substrate. Thus, the circuit area DRA may be included in an emissive area of each sub-pixel rather than being separately defined. Accordingly, the separate circuit area DRA may not be defined.

As shown in FIG. 11, the pixels according to a third example of the second aspect may be formed in such a way that a plurality of pixels that surrounds one transparent area TRA shares one transparent area TRA in the same or similar form as in the first example. In this case, when the transparent area TRA is excluded, one pixel PIXEL may have a cross shape including the red emissive area EMA_R, the white emissive area EMA_W, the blue emissive area EMA_B, and the green emissive area EMA_G.

As such, an emissive area included in one pixel PIXEL has a cross shape because two emissive areas that emit light with the same color are adjacently positioned on each side that surrounds the transparent area TRA. Here, one emissive area may have a width corresponding to ½ of a horizontal or vertical side of the transparent area TRA.

FIG. 11 illustrates an example in which the white emissive area EMA_W and the red emissive area EMA_R disposed in a horizontal direction are adjacently disposed to each other and the blue emissive area EMA_B and the green emissive area EMA_G disposed in a vertical direction are spaced apart from each other, but this is merely exemplary and the present disclosure is not limited thereto.

As shown in FIG. 12, the pixels according to a fourth example of the second aspect may be formed in such a way that a plurality of pixels that surrounds one transparent area TRA shares one transparent area TRA in the same or similar form as in the second example. In this case, when the transparent area TRA is excluded, one pixel PIXEL may have a cross shape including the red emissive area EMA_R, the white emissive area EMA_W, the blue emissive area EMA_B, and the green emissive area EMA_G.

As such, an emissive area included in one pixel PIXEL has a cross shape because two emissive areas that emit light with the same color are adjacently positioned on each side that surrounds the transparent area TRA. Here, one emissive area may have a width corresponding to a horizontal or vertical side of the transparent area TRA.

FIG. 12 illustrates an example in which the white emissive area EMA_W and the red emissive area EMA_R disposed in a horizontal direction are adjacently disposed to each other and the blue emissive area EMA_B and the green emissive area EMA_G disposed in a vertical direction are spaced apart from each other, but this is merely exemplary and the present disclosure is not limited thereto.

As shown in FIG. 13, the blue emissive area EMA_B of the blue sub-pixel may be defined by the blue data line DL_B disposed on the left, the first reference line REF1 disposed on the right, and the first scan line GL1 disposed at a lower side. The green emissive area EMA_G of the green sub-pixel may be defined by the first driving voltage line EVDD disposed on the left, the green data line DL_G disposed on the right, and the first scan line GL1 disposed at the lower side.

The second driving voltage line EVSS, the red data line DL_R, and the white data line DL_W may be positioned at a left side of the blue data line DL_B. The transparent area TRA of the blue sub-pixel may be positioned at a left side of the red data line DL_R, and the transparent area TRA of the green sub-pixel may be positioned at a right side of the green data line DL_G, but the present disclosure is not limited thereto.

The blue sub-pixel and the green sub-pixel that are adjacent to each other may be symmetric with each other right and left based on the first reference line REF1 and the first driving voltage line EVDD to share the first reference line REF1 and the first driving voltage line EVDD. That is, the sensing transistor SE and the driving transistor DT that are respectively included in two sub-pixel may be arranged to be symmetric with each other to share the first reference line REF1 and the first driving voltage line EVDD that are disposed therebetween.

Each of the blue sub-pixel and the green sub-pixel may include the switching transistor SW, the sensing transistor SE, the driving transistor DT, the storage capacitor CST, and the organic light emitting diode (not shown). In addition, as described above with reference to FIG. 7, based on the first scan line GL1, an arrangement relationship of the switching transistor SW, the sensing transistor SE, the driving transistor DT, the storage capacitor CST, and the organic light emitting diode (not shown) may be the same as in the blue sub-pixel and the green sub-pixel, which will be described below.

The switching transistor SW and the sensing transistor SE are connected to the first scan line GL1, and thus, may be disposed at a lower side (a lower side of a storage capacitor) adjacent to the first scan line GL1. The driving transistor DT may be disposed at an upper side (an upper side of the storage capacitor) that is far away from the switching transistor SW and the sensing transistor SE.

The storage capacitor CST may be connected to the switching transistor SW, the sensing transistor SE, the driving transistor DT, and the organic light emitting diode (not shown) and requires a wide space in order to form capacitance, and thus, may be disposed between the switching transistor SW (or a sensing transistor) and the driving transistor DT. However, although each of the sub-pixels according to aspects of the present disclosure includes the switching transistor SW, the sensing transistor SE, the driving transistor DT, the storage capacitor CST, and the organic light emitting diode (not shown), but the present disclosure is not limited thereto.

As shown in FIG. 14, one pixel may have a cross shape when the transparent area TRA is excluded. When one pixel has a cross shape, all circuits DT, SW, SE, and CST included in one pixel may be symmetric with each other up and down or right and left.

In addition to the above description, the blue sub-pixel and the green sub-pixel that are arranged in a vertical direction may be symmetric with each other right and left based on the first reference line REF1 and the first driving voltage line EVDD. The white sub-pixel and the red sub-pixel that are arranged in a horizontal direction may be symmetric with each other up and down based on the first scan line GL1. However, this is merely exemplary and at least one of circuits DT, SW, SE, and CST included in one pixel may not be symmetric with each other up and down or right and left.

The aforementioned second aspect of the present disclosure may have an effect of minimizing the width of a bank layer that occupies the largest area to embody a pixel having an emissive area and a transparent area. In addition, the second aspect of the present disclosure may have an effect of enhancing transparency and haze characteristics by providing a pixel structure in which circuits are formed at intersections between horizontal and vertical regions and a plurality of adjacent emissive areas (sub-pixels) share one transparent area.

According to the aforementioned first and second aspects of the present disclosure, as seen from Table 1 below, transparency defined by a transparent area is enhanced while maintaining an aperture ratio defined by an emissive area at a level of 30% which is the same or similar as in the conventional case. In Table 1 below, a conventional structure is formed in such a way that all emissive areas of red, green, blue, and white sub-pixels are adjacently and closed to each other and a region adjacent thereto is used as a transparent area.

TABLE 1

| Division | Conventional structure | First Aspect | Second Aspect |
| --- | --- | --- | --- |
| Transparency | 40% | 50.7% (+10.7%) | 52.4% (+12.4%) |
| Aperture ratio | 30% | 30% | 30% |

The present disclosure may have an effect of enhancing transparency and haze characteristics by embodying a sub-pixel to minimize the width of a bank layer that occupies the largest area to embody a pixel having an emissive area and a transparent area and to configure the transparent area that is relatively wide compared with the emissive area.

What is claimed is:

1. A display device comprising:
a lower substrate; and
a pixel including sub-pixels having one transparent area defined to transmit light from the lower substrate and a plurality of emissive areas adjacent to the one transparent area and defined to emit light with at least three different colors,
wherein at least one sub-pixel of the sub-pixels or the pixel have an "L" shape or a reversed "L" shape, which surrounds a first surface and a second surface of the one transparent area,
wherein one of the plurality of emissive area has an "L" shape, and
wherein an emissive area having a cross shape is disposed on the lower substrate and is configured by two emissive areas having the "L" shape that are adjacent to each other and emit light with a same color.

2. The display device of claim 1, wherein the plurality of emissive areas surround the one transparent area.

3. The display device of claim 1, wherein the one transparent area has a square shape having four sides surrounded by the plurality of emissive areas included in at least two pixels.

4. The display device of claim 1, wherein one of the plurality of emissive areas has a width corresponding to ½ of a horizontal or vertical side of the one transparent area.

5. The display device of claim 1, wherein one of the plurality of emissive areas has a width corresponding to a horizontal or vertical side of the one transparent area.

6. The display device of claim 5, wherein the one emissive area is divided in a horizontal or vertical direction.

7. The display device of claim 1, wherein a portion adjacent to the two emissive areas has a diagonal shape.

* * * * *